United States Patent
Onishi et al.

[11] Patent Number: 5,868,302
[45] Date of Patent: Feb. 9, 1999

[54] METHOD AND APPARATUS FOR MOUNTING ELECTRONIC COMPONENT

[75] Inventors: Hiroaki Onishi, Higashiosaka; Masato Hirano, Osaka, both of Japan

[73] Assignee: Matsushita Electric Industrial Co., Ltd., Osaka-fu, Japan

[21] Appl. No.: 707,392

[22] Filed: Sep. 4, 1996

[30] Foreign Application Priority Data

Sep. 6, 1995 [JP] Japan .................................. 7-229069

[51] Int. Cl.⁶ ............... B23K 1/00; B23K 3/08; B23K 31/02
[52] U.S. Cl. .................. 228/180.21; 228/215; 228/41; 118/504; 427/282
[58] Field of Search .............. 228/180.21, 215, 228/248.1, 41; 118/504; 427/282

[56] References Cited

U.S. PATENT DOCUMENTS 4,918,277  4/1990  Zimmer ...................... 228/215
5,460,316  10/1995  Hefele ....................... 228/248.1

FOREIGN PATENT DOCUMENTS 4-262866  9/1992  Japan ..................... 228/180.21

OTHER PUBLICATIONS

"A Metal Mask and Screen Assembly for Printing Thick-Films onto Substrates . . . ," *RCA Technical Notes*, TN No. 978; Sep. 17, 1974.

J.A. Slattery & C.E.T. White, "A Primer on the use of Solder Creams in Hybrid Assembly," *Electronic Packaging and Production*, Oct. 1981, pp. 146–156.

*Primary Examiner*—Patrick Ryan
*Assistant Examiner*—Jeffrey T. Knapp
*Attorney, Agent, or Firm*—Wenderoth, Lind & Ponack, L.L.P.

[57] ABSTRACT

In a method and a device for mounting an electronic component, a solder paste is printed on lands of a substrate with the use of a mask having a projecting part at a portion facing the substrate and positioned to between neighboring lands, and the projecting part prevents the solder paste on of the neighboring lands from flowing so as to come in contact with a other of the neighboring land to cause a shortcircuit between the neighboring lands.

20 Claims, 4 Drawing Sheets

METHOD AND APPARATUS FOR MOUNTING ELECTRONIC COMPONENT

BACKGROUND OF THE INVENTION

The present invention relates to a method and an apparatus for mounting electronic components, each having many leads with a narrow pitch, to a substrate such as a printed board or the like.

Various methods have been proposed heretofore to mount electronic components, each having a plurality of leads projected in parallel in two or four directions, to a substrate on the surface of which lands are formed correspondingly to the leads. One example of the methods will be described with reference to the related drawings hereinbelow. FIGS. 6A and 6B are a plan view and a longitudinal sectional view indicating the general mounting state of an electronic component to a substrate. FIGS. 7A and 7B are longitudinal sectional views of the substrate in a process of printing/applying a solder paste according to the conventional method, and FIGS. 8A and 8B are longitudinal sectional views of the substrate and an electronic component in a mounting and reflow process. In each figure, reference numerals 10–17 respectively represent the electronic component, the substrate, a land, a lead of the electronic component 10, a mask, the solder paste, a squeegee, and solder shortcircuiting the lands 12. In the solder paste printing/applying process first carried out for mounting the electronic component, as shown in FIG. 7A, the mask 14 is positioned and overlapped over the substrate 11, and the squeegee 16 kept in touch with the mask 14 with a suitable printing pressure is moved linearly along a printing direction, so that the solder paste 15 is filled in opening parts 14a of the mask 14. When the mask 14 is subsequently separated from the substrate 11, the solder paste 15 is printed and applied onto the substrate 11 via the mask 14 as shown in FIG. 7B. In the next mounting process, the electronic component 10 is held by suction by a mounting nozzle so that the leads 13 of the electronic component 10 are registered with the corresponding lands 12, as indicated in FIG. 8A. The leads 13 of the electronic component 10 are placed on the solder paste 15 printed/applied on the lands 12, whereby the leads 13 of the electronic component 10 are fixedly held by the adhesion force of the solder paste 15. As a result of this, the electronic component 10 is sent to the next process in the fixed state. In the final reflow process, the leads 13 of the electronic component 10 are heated by hot wind or a heat source, e.g., infrared heater or the like, so that the solder paste 15 printed/applied in the previous process is melted. The leads 13 of the electronic component 10 are thus solder-bonded to the lands 12.

The recent rapid trend of the electronic components such as IC package components and the like becoming more compact and of a thinner structure induces a narrower pitch of the leads 13 of the components, specifically, 0.5 mm to 0.4 mm and even not larger than 0.3 mm. Naturally, the lands 12 on the substrate 11 holding the above thin and compact electronic component 10 consequently are to be formed with a reduced pitch. However, although it is easy to form the lands of not larger than 0.3 mm pitch according to the current technique, there is a performance difference among the substrate manufacturers to form a solder resist between lands which is done generally with a pitch of 0.5 mm or 0.4 mm, in other words, it is not always possible to form the solder resist with such a narrow pitch as referred to above for every substrate.

In this situation, when the electronic component 10 with a narrow pitch of the leads is mounted with the use of the substrate 11 where the solder resist is not formed between the lands 12, the land 12 may be shifted from the opening part 14a when the substrate 11 is positioned and overlapped with the mask 14 as shown in FIG. 7A, and in consequence the solder paste 15 filled in the opening part 14a by the squeegee 16 leaks out from a gap X between the land 12 and the opening part 14a eventually to come in contact with an end part of the adjacent land 12 as is clearly shown in FIG. 7B. If the lead 13 of the electronic component 10 is placed on the corresponding land 12 in the state as shown in FIG. 8A and the reflow treatment is performed, the solder 17 might shortcircuit the lands 12 adjacent to each other as denoted by Y in FIG. 8B.

SUMMARY OF THE INVENTION

The object of the present invention is therefore to provide a method and an apparatus for mounting electronic components even to a substrate without a solder resist formed between narrowly pitched lands, whereby the adjacent lands passed through a reflow process are not shortcircuited by the solder, thereby improving the solder-bonding quality.

In accomplishing these and other objects, according to one aspect of the present invention, there is provided a method for mounting an electronic component, which comprises steps of:

printing/applying a solder paste on lands of a substrate with the use of a mask having a projecting part facing the substrate and positioned between neighboring lands; and preventing, by the projecting part, the solder paste on one of the neighboring lands from flowing so as to come in touch with the other of the neighboring lands and causing a shortcircuit between the neighboring lands.

According to another aspect of the present invention, there is provided an apparatus for mounting an electronic component wherein a solder paste is printed on lands of a substrate. The apparatus comprises a mask that includes a projecting part at a position of the mask which faces the substrate and corresponds to between neighboring lands and prevents the solder paste on one of the neighboring land from flowing so as to come in touch with the other of the neighboring lands and causing a shortcircuit between the neighboring lands.

Even if a gap is generated as a result of the positional shift between the land and the opening part when the substrate without a solder resist formed between lands is registered with the mask, the solder paste is never in touch with an end part of the adjacent land by the projecting part located between the neighboring opening parts. Accordingly, it is prevented that the adjacent lands are shortcircuited by the solder after the reflow process. Moreover, if the mask is an integral structure of a projecting part and a main body, the projecting part is very strong and tough to external stress and therefore withstands breaks, etc. over a long period of.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1A:
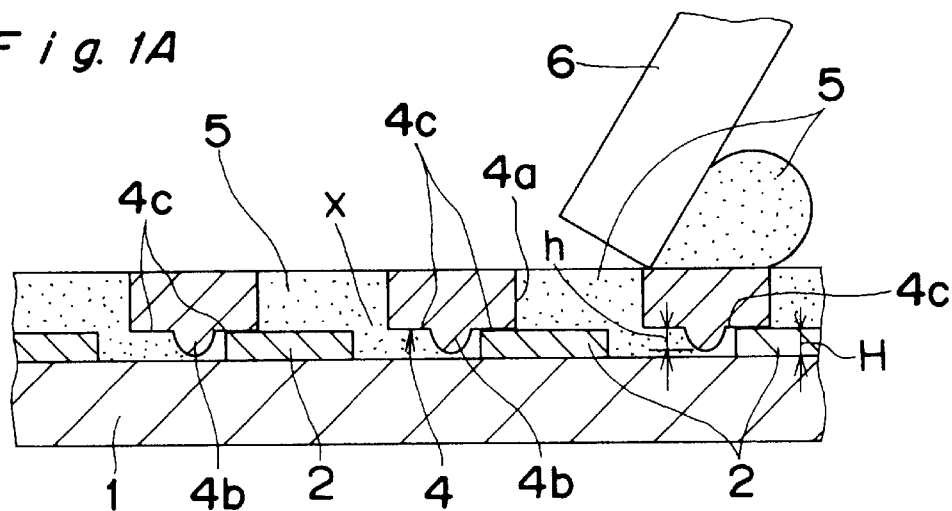
FIGS. 1A and 1B are longitudinal sectional views of a substrate in a process of printing/applying a solder paste according to one embodiment of a mounting method of the present invention.

Before the description of the present invention proceeds, it is to be noted that like parts are designated by like reference numerals throughout the accompanying drawings.

Figure 6A:
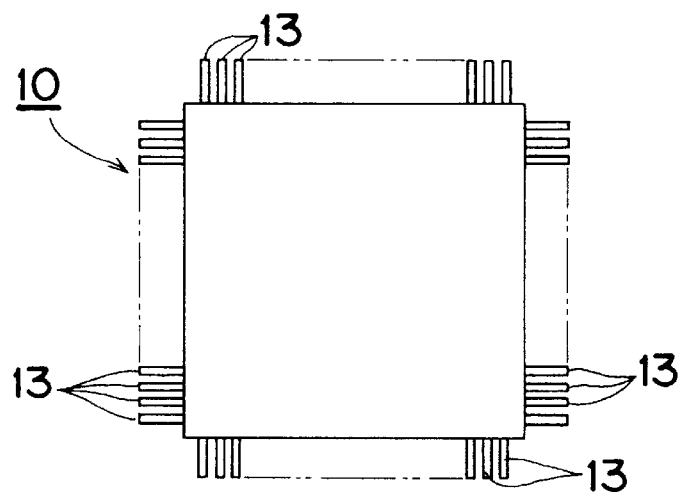
FIGS. 6A and 6B are a plan view and a longitudinal sectional view showing the general state of mounting an electronic component to a substrate.
Figure 6B:
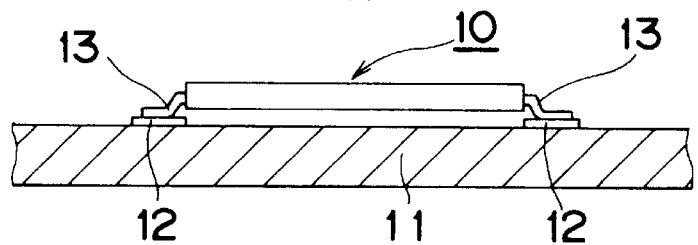
Figure 7A:
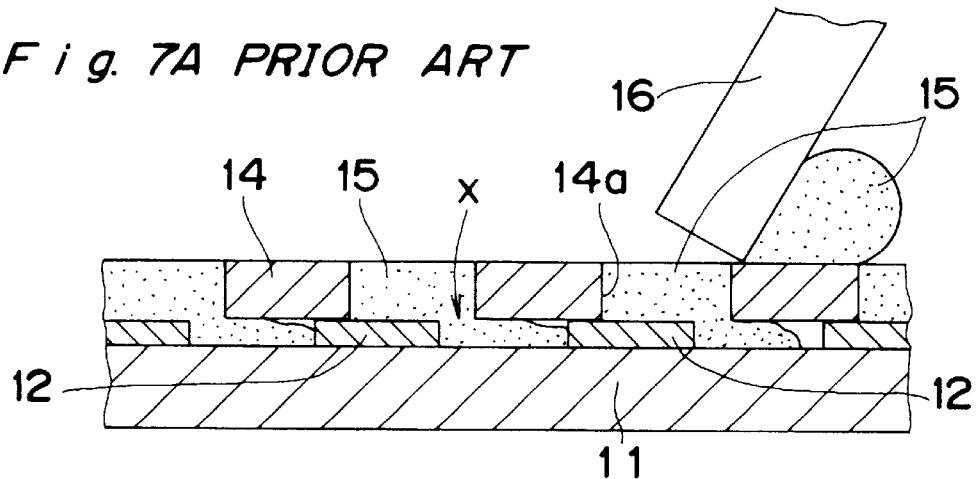
FIGS. 7A and 7B are longitudinal sectional views of a substrate in a process of printing/applying a solder paste in a conventional mounting method.
Figure 7B:
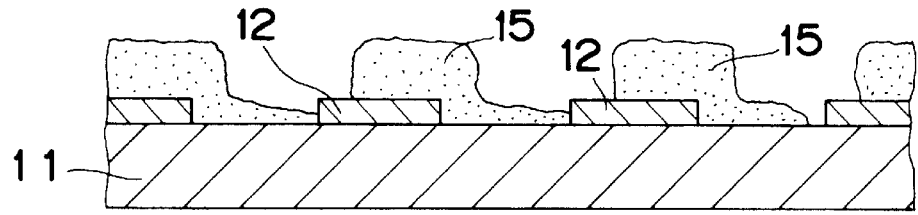
Figure 8A:
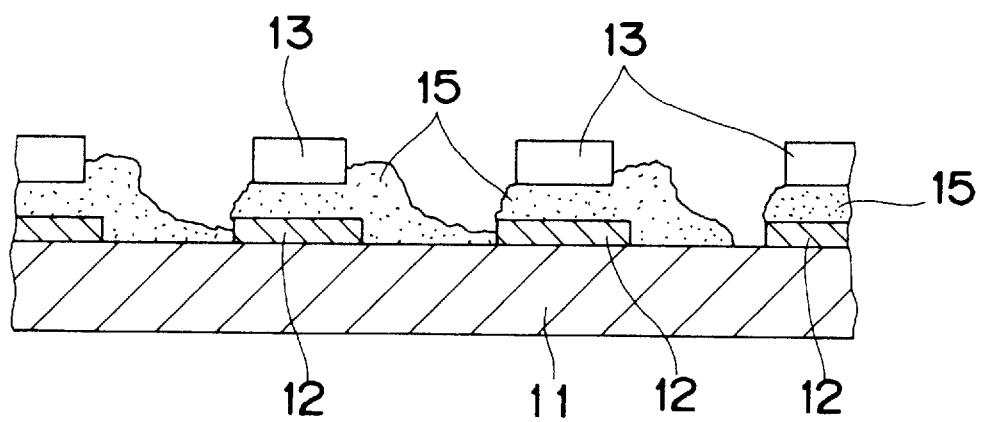
FIGS. 8A and 8B are longitudinal sectional views of a substrate in a process of mounting/reflowing an electronic component in the conventional mounting method.
Figure 8B:
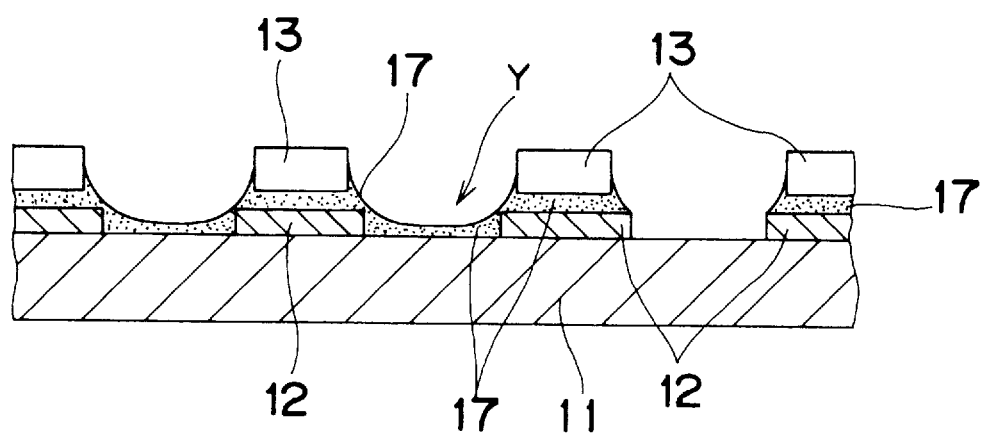

The present invention will be described in conjunction with preferred embodiments thereof with reference to the accompanying drawings. It is to be noted here that the constitution and the like of an electronic component to be mounted are the same as those shown in FIGS. 6A and 6B.

Figure 1B:
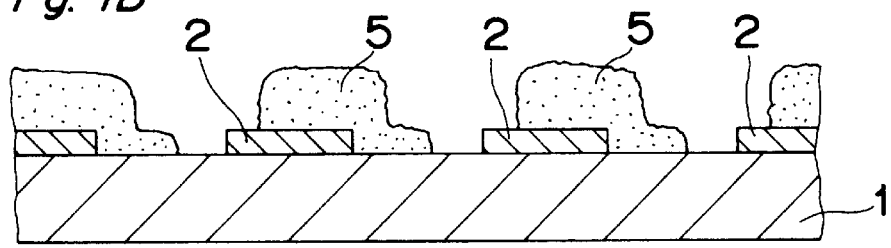
Figure 2A:
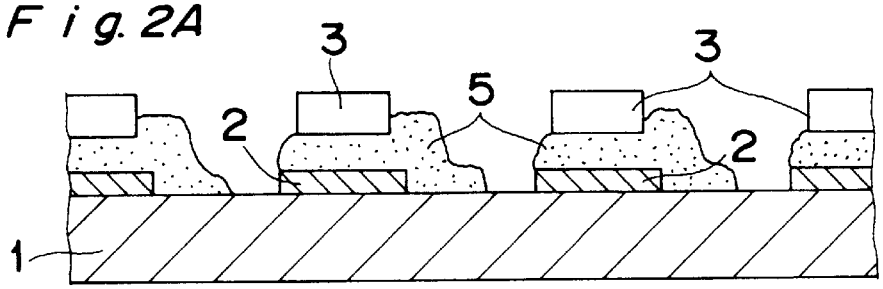
FIGS. 2A and 2B are longitudinal sectional views of the substrate in a process where an electronic component is mounted and subjected to a reflow treatment in one embodiment of the present invention.
Figure 2B:
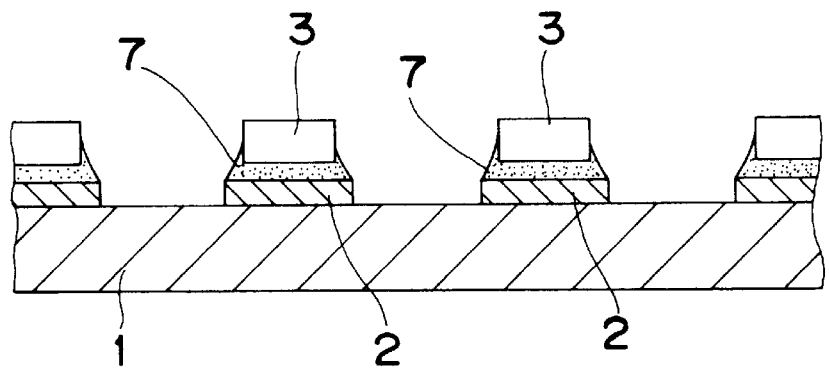

FIGS. 1A and 1B are longitudinal sectional views of a substrate while a solder paste is printed/applied to the substrate. FIGS. 2A and 2B are longitudinal sectional views of the substrate while an electronic component is treated through mounting and reflow processes. In each of these figures, reference numerals 1–7 are respectively a substrate, a land, a lead of an electronic component, a mask, a solder paste, a squeegee, and a fused solder. Referring first to FIG. 1A, on the surface of the substrate 1 are formed many strips of lands 2 via a narrow pitch of approximately 0.3 mm. A solder resist is not formed between two adjacent lands 2. A projecting part 4b, for preventing the solder paste 5 on the land 2 from flowing so as to come in touch with the neighboring land 2 and causing a shortcircuit between the neighboring lands 2, is formed at the substrate surface side of the mask 4 at a position between the adjacent lands 2 of the substrate 1. The projecting part 4b of the mask 4 can be obtained in a known method, e.g., by etching metal plate or layering metal on a base plate as in the case of plating (referred to as a "full additive" step) to thereby form a mask and subsequently bonding or joining the projecting part 4b. Since such a complex structure is easy to break, that is, low in durability, the projecting part 4b is preferably one-piece with the mask 4, i.e., formed integrally with the mask 4. Alternatively, after the mask 4 is integrally formed with the projecting part 4b in a thickness including the thickness of the projecting part 4b and then the mask 4 is etched to a target thickness with the projecting part 4b left, or, a recessed part corresponding to the projecting part 4b is etched or mechanically machined beforehand in the base plate at the full additive step and metal is layered on the base plate. Other methods may be applicable.

In order to mount the electronic component, the substrate 1 and mask 4 of the above constitution are positioned and overlapped, and the squeegee 6 is linearly moved along a printing direction while kept in touch with the mask 4 with an appropriate pressure, to thereby fill the solder paste 5 into opening parts 4a of the mask 4. The solder paste 5 is printed/applied on the substrate 1 via the mask 4 when the mask 4 is separated from the substrate 1. At this time, even if the solder paste 5 leaks from a gap X generated due to the positional shift between the land 2 and an opening part 4a of the mask 4, the projecting part 4b obstructs the leaking solder paste 5 and therefore, the solder paste 5 is printed/applied without touching an end part of the neighboring land 2 as shown in FIG. 1B.

The electronic component is held by suction by a mounting nozzle to position the leads 3 of the electronic component over the corresponding lands 2 as shown in FIG. 2A. As the leads 3 are set on the solder paste 5 printed/applied to the lands 2, the leads 3 of the electronic component are held by the adhesive force of the solder paste and sent to the next process. The leads 3 of the electronic component are heated by hot wind or a heat source such as an infrared heater or the like. The solder paste 5 printed/applied previously is melted, whereby the leads 3 of the electronic component are solder-bonded with the lands 2. At this time, since the solder paste 5 is not in touch with the end part of the adjacent land 2, the lands 2 adjacent to each other are not shortcircuited after the reflow process even when the substrate 1 is positionally shifted from the mask 4 at the time of printing the solder paste 5. Thus, mounting is reliably carried out.

Figure 3:
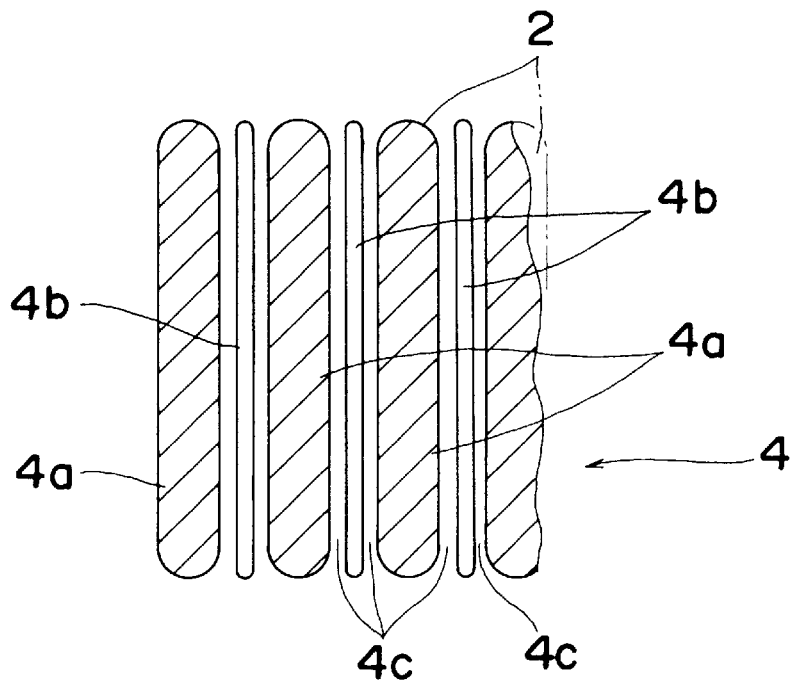
FIG. 3 is a plan view showing the relationship between opening parts of a mask and lands in arrangement in the embodiment.

In the embodiment, it is preferable that, as shown in FIG. 3, when the shape of the opening part 4a of the mask 4 is approximately the same as that of the land 2, the length of the projecting part 4b of the mask 4 is approximately the same as that of the opening part 4a so as to prevent the solder paste from flowing to come in contact with the neighboring land, and is located at an approximately middle position of a frame part 4c between the neighboring opening parts 4a of the mask 4 in a widthwise direction of the projecting part 4b. In this case of FIG. 3, it is unnecessary to arrange the projection part on the left of the left-end-side opening part 4a because there is no adjacent opening part.

Figure 4:
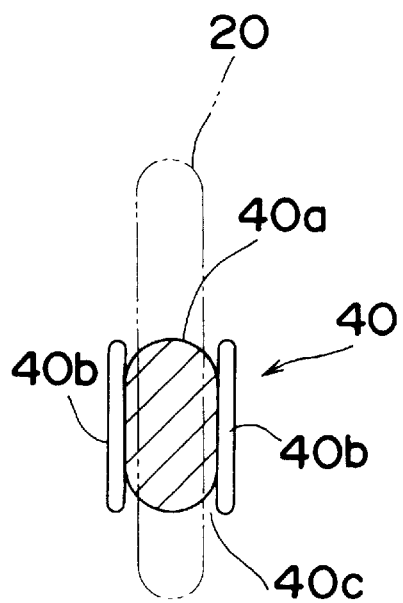
FIG. 4 is a plan view showing the relationship between opening parts of a mask and lands in arrangement in another embodiment of the present invention.

As shown in FIG. 4, when the shape of an opening part 40a of the mask 40 is smaller than that of a land 20, the length of the projecting part 40b is approximately the same as that of the opening part 40a of the mask 40 so as to prevent the solder paste from flowing to come in touch with the neighboring land. It is preferable that the projecting parts 40b are located on both sides of one opening part 40a.

Figure 5:
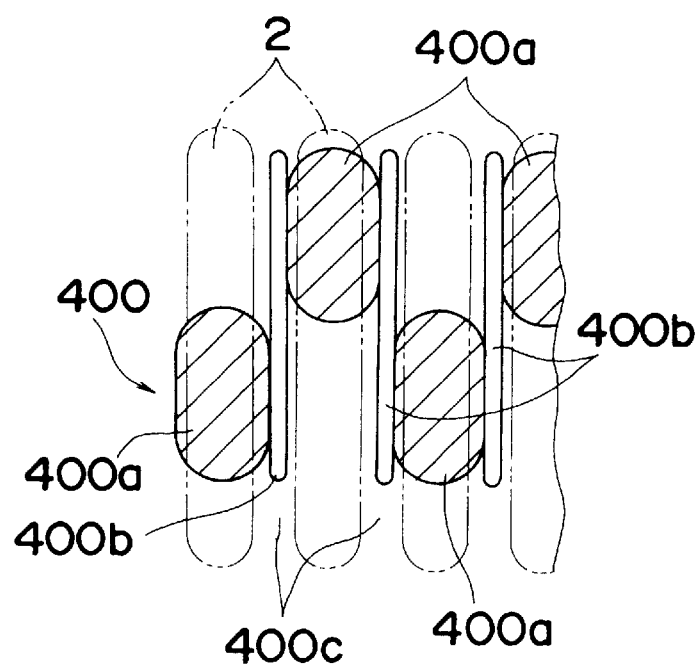
FIG. 5 is a plan view showing the relationship between opening parts of a mask and lands in arrangement in a further embodiment of the present invention.

In the above description, the opening part 4a of the mask 4 is of nearly the same size as that of the land 2 or slightly smaller than the land 2. As the pitch of lands becomes narrower, as shown in FIG. 5, opening parts 400a of a mask 400 larger than the lands 2 in their widthwise direction are arranged in a zigzag pattern in some cases to improve the slipperiness of the solder paste from the opening parts 400a at the time of printing as shown in FIG. 5. Even in this case, the length of the projecting part 400b is a length between one end of the opening part 400a and the other end of the adjacent opening part 400a in a lengthwise direction of the projecting part 400b so as to prevent the solder paste from flowing to come in touch with the neighboring land. Thus, the solder paste 5 is printed/applied without touching the end part of the adjacent land 2 owing to the projecting part 400b of the mask 400, similar to the above example, so that the adjacent lands 2 are not shortcircuited by the solder paste 5 after the reflow process, thus achieving reliable mounting of the electronic component.

It is preferable that the height (thickness) h of each of the projecting parts 4b, 40b, 400b is not larger than the height (thickness) H of each of the lands 2, 20 (see FIG. 1). More preferably, the difference (H–h) between the heights of the projection part and land is not larger than an average diameter of metal particles in the solder paste 5. For example, when an average diameter of metal particles of solder paste for QFP (Quad Flat Package) is 30 μm, the difference (H–h) is not larger than 30 μm. The reason is that when the height of the projecting part 4b, 40b, 400b is smaller than such a value, a gap between the projecting part 4b, 40b, 400b and the surface of the substrate 1 is too large to prevent the solder paste 5 on the land 2 from flowing to come in touch with the neighboring land 2. In order to reliably prevent the solder paste 5 from flowing to come in touch with the neighboring land 2 to cause a shortcircuit between them, it is preferable that the width of each of the opening parts 4a, 40a, 400a is not larger than that of each the lands 2, 20 and it is preferable that each of the projecting parts 4b, 40b, 400b is located at an approximately middle position of the frame part 4c, 40c, 400c between the neighboring opening parts 4a, 40a, 400a of the mask 4, 40, 400 in a widthwise direction of the projecting part, and one of the parts of the frame part 4c, 40c, 400c defined by the projecting part 4b, 40b, 400b is always in touch with the land 2 or 20. Since each of the projecting parts 4b, 40b, 400b is located at an approximately middle position of the frame part 4c, 40c, 400c, the effect can be accomplished even when the mask 4, 40, 400 is shifted to either side in the widthwise direction of the projecting part.

As is discussed hereinabove, according to the present invention, even when the land is positionally shifted from the opening part to thereby bring about a gap when the substrate without a solder resist formed between lands is registered with the mask, or even when the opening part is formed larger than the land, the solder paste does not come in touch with the end part of the adjacent land by the projecting part located between the neighboring opening parts, so that the adjacent lands are not shortcircuited by the solder after the reflow process. Accordingly, electronic components are reliably solder-bonded with high quality even with a narrow pitch. Moreover, the projecting part of the mask at the side of the substrate is integral with the mask and hence becomes very strong. The mask is consequently withstand the external stress, resistant to breakage or the like, durable and suitable for a long-period of service.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for mounting an electronic component, which comprises:
   printing/applying a solder paste on lands of a substrate with the use of a mask having a projecting part facing the substrate and positioned between two neighboring lands; and
   preventing, by the projecting part, the solder paste an one of the neighboring lands from flowing so as to come in touch with the other of the neighboring lands and causing a shortcircuit between the neighboring lands.

2. The method for mounting electronic components according to claim 1, wherein the projecting part is integrally formed with a main body of the mask.

3. The method according to claim 2, further comprising, after said printing/applying and said preventing:
   setting an electronic component on the substrate so that leads of the electronic component are placed over corresponding lands; and
   reflowing the solder paste.

4. An apparatus for mounting an electronic component wherein a solder paste is printed on lands of a substrate, said apparatus comprising a mask that includes a projecting part at a position of the mask which faces the substrate and corresponds to between neighboring lands and prevents the solder paste on one of the neighboring lands from flowing so as to come in touch with the other of the neighboring lands and causing a shortcircuit between the neighboring lands.

5. The apparatus according to claim 4, wherein the projecting part is integrally formed with a main body of the mask.

6. The apparatus according to claim 4, wherein a width of an opening part of the mask is not larger than that of the lands.

7. The apparatus according to claim 4, wherein the projecting part is located at an approximately middle position of a frame part between neighboring opening parts of the mask in a widthwise direction of the projecting part, and the frame part associated with the projecting part is able to come in touch with a land.

8. The apparatus according to claim 4, wherein when a shape of an opening part of the mask is smaller than that of a land, a length of the projecting part is approximately the same as that of the opening part.

9. The apparatus according to claim 8, wherein a height of the projecting part is not larger than that of the lands.

10. The apparatus according to claim 9, wherein a difference between a height of the projecting part and a height of the lands is not larger than an average diameter of metal particles in the solder paste.

11. The apparatus according to claim 4, wherein opening parts of the mask are arranged in a zigzag pattern and the projecting part is disposed between an adjacent pair of the opening parts, and a length of the projecting part is approximately the same as a length between one end of one of said adjacent pair of said opening parts and the other end of the other of said adjacent pair of said opening parts in a lengthwise direction of the projecting part.

12. The apparatus according to claim 11, wherein a height of the projecting part is not larger than that of the lands.

13. The apparatus according to claim 12, wherein a difference between a height of the projecting part and a height of the lands is not larger than an average diameter of metal particles in the solder paste.

14. The apparatus according to claim 4, wherein a height of the projecting part is not larger than that of the lands.

15. The apparatus according to claim 14, wherein a difference between a height of the projecting part and a height of the lands is not larger than an average diameter of metal particles in the solder paste.

16. The apparatus according to claim 14, wherein the projecting part is located at an approximately middle position of a frame part between neighboring opening parts of the mask in a widthwise direction of the projecting part, and the frame part associated with the projecting part is able to come in touch with a land.

17. The apparatus according to claim 4, wherein when a shape of an opening part of the mask is approximately the same as that of a land, a length of the projecting part is approximately the same as that of the opening part.

18. The apparatus according to claim 17, wherein the projecting part is located at an approximately middle position of a frame part between neighboring opening parts of the mask in a widthwise direction of the projecting part, and the frame part associated with the projecting part is able to come in touch with a land.

19. The apparatus according to claim 17, wherein a height of the projecting part is not larger than that of the lands.

20. The apparatus according to claim 19, wherein a difference between a height of the projecting part and a height of the lands is not larger than an average diameter of metal particles in the solder paste.

\* \* \* \* \*